US009755575B1

(12) United States Patent
Wang et al.

(10) Patent No.: US 9,755,575 B1
(45) Date of Patent: Sep. 5, 2017

(54) VARIABLE FREQUENCY RC OSCILLATOR

(71) Applicant: QUALCOMM Incorporated, San Diego, CA (US)

(72) Inventors: Kevin Wang, Poway, CA (US); Chao Song, San Diego, CA (US); Shyam Sivakumar, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/191,350

(22) Filed: Jun. 23, 2016

Related U.S. Application Data

(60) Provisional application No. 62/302,735, filed on Mar. 2, 2016.

(51) Int. Cl.
| | |
|---|---|
| H03K 3/03 | (2006.01) |
| H03B 5/24 | (2006.01) |
| H03L 7/099 | (2006.01) |
| H03K 5/1252 | (2006.01) |
| H03K 5/06 | (2006.01) |

(52) U.S. Cl.
CPC ............... *H03B 5/24* (2013.01); *H03K 5/065* (2013.01); *H03K 5/1252* (2013.01); *H03L 7/099* (2013.01)

(58) Field of Classification Search
CPC ....... H03K 5/065; H03K 5/1252; H03L 7/099
USPC .... 331/57, 47; 327/276, 277, 283, 264, 261, 327/175, 172
See application file for complete search history.

(56) References Cited

U.S. PATENT DOCUMENTS

| | | | |
|---|---|---|---|
| 5,519,265 A | 5/1996 | Latham, II | |
| 5,552,748 A | 9/1996 | O'Shaughnessy | |
| 7,245,519 B2 | 7/2007 | McQuirk et al. | |
| 8,222,966 B2 * | 7/2012 | Ravi | H03C 3/10 332/144 |
| 2006/0290436 A1 * | 12/2006 | Forbes | H03K 3/0315 331/57 |
| 2008/0136545 A1 | 6/2008 | Fayneh et al. | |
| 2013/0320955 A1 | 12/2013 | Kratyuk et al. | |

FOREIGN PATENT DOCUMENTS

WO 2013141837 A1 9/2013

OTHER PUBLICATIONS

Bala F., et al., "Programmable High Frequency RC Oscillator," Proceedings of the 18th International Conference on VLSI Design held jointly with 4th International Conference on Embedded Systems Design (VLSID'05), 2005, 5 pages.

Ghidini C., et al., "A Digitally Programmable On-Chip RC-Oscillator in 0.25μm CMOS Logic Process," IEEE International Symposium on Circuits and Systems, 2005, vol. 1, pp. 400-403.

Written Opinion—PCT/US2017/017518—ISA/EPO—May 3, 2016.

International Search Report—PCT/US2017/017518—ISA/EPO—May 3, 2017.

\* cited by examiner

*Primary Examiner* — Arnold Kinkead
(74) *Attorney, Agent, or Firm* — Haynes and Boone, LLP

(57) ABSTRACT

An oscillator circuit having a programmable output frequency may include a first delay section having a negative gain and a variable delay that is set by a control signal provided to the first delay section. A second delay section having a negative gain and a fixed delay may be connected in series with the first delay section. The oscillator circuit may include an output comprising the output of the second delay section having a frequency that is dependent on the (Continued)

delay of the first delay section and the delay of second delay section.

23 Claims, 7 Drawing Sheets

VARIABLE FREQUENCY RC OSCILLATOR

CROSS REFERENCE TO RELATED APPLICATIONS

Pursuant to 35 U.S.C. §119(e), this application is entitled to and claims the benefit of the filing date of U.S. Provisional App. No. 62/302,735 filed Mar. 2, 2016, the content of which is incorporated herein by reference in its entirety for all purposes.

TECHNICAL FIELD

The present disclosure relates generally to oscillators, and more particularly to an RC oscillator having a variable frequency.

BACKGROUND

In the design of digital logic circuits, large scale integration techniques have brought about the construction of large numbers of components being fabricated on a single chip of silicon. Digital circuitry typically require various clock signals to provide a time base for their operation. Such clock signals are generated by oscillator circuits, which come in a variety of designs. One such design is based on a resistor/capacitor (RC) network, referred to as an RC oscillator.

Conventional RC oscillators can provide a low-cost timing source. Furthermore, conventional RC oscillators avoid the use of inductors (see, for example, FIG. 5), which can be difficult to fabricate on integrated circuits. RC oscillators may allow for generation of variable frequencies by changing the resistance R, or capacitance C to increase their utility.

SUMMARY

In accordance with aspects of the present disclosure, an oscillator circuit having a programmable output frequency may comprise a first delay section having an input end and an output end. The first delay section may have a negative gain between the input end and the output end and a variable delay that is set by a control signal provided to the first delay section. The oscillator may further comprise a second delay section electrically connected in series with the first delay section. The second delay section may have an input end and an output end and a negative gain between the input end and the output end. The second delay section may have a fixed delay. The oscillator may further comprise a circuit output for an output signal having a frequency that is a function of the delay due to the first delay section and the second delay section. The circuit output may comprise the output end of the second delay section.

In some embodiments, the first delay section may include a first RC network comprising a resistor and a variable capacitor, and a second RC network connected in series with the first RC network and also comprising a resistor and a variable capacitor. A delay of the first delay section may be determined based on capacitances of the variable capacitors of the first and second RC networks. The control signal may set the capacitance of the variable capacitor of the first RC network, and an additional control signal may set the capacitance of the variable capacitor of the second RC network.

In some embodiments, the first delay section may include an RC network comprising a resistor and a variable capacitor. The control signal provided to the first delay section may set a capacitance of the variable capacitor of the first RC network. A delay of the first delay section may be based on the capacitance of the variable capacitor.

In some embodiments, the first delay section may include a plurality of switched capacitors, wherein the control signal selectively sets each of the plurality of switched capacitors to an ON state or an OFF state. In some embodiments, when a switched capacitor is in the ON state, the switched capacitor has a node electrically connected to a DC voltage. In other embodiments, when a switched capacitor is in the ON state, the switched capacitor has a node electrically connected to ground potential. The control signal may be an n-bit word.

In some embodiments, the second delay section may include an RC network comprising a fixed value resistive component and a fixed value capacitive component. At least one node of the fixed value capacitive component may swing above supply voltage of the oscillator circuit. In some embodiments, the at least one node of the fixed value capacitive component may swing below ground potential.

In some embodiments, the first delay section may be electrically connected to the circuit output via the second delay section in a feedback loop.

In accordance with aspects of the present disclosure, an oscillator circuit may comprise a first delay section having an input end and an output end. The first delay section may have a negative gain between the input end and the output end. The first delay section may include a first RC network comprising a resistor and a variable capacitor and a second RC network connected in series with the first RC network and comprising a resistor and a variable capacitor. The oscillator circuit may include at least one control signal provided to at least the variable capacitor of the first RC network to set a delay of the first delay section. The oscillator circuit may include a second delay section electrically connected in series with the first delay section. The second delay section may have an input end and an output end, and a negative gain between the input end and the output end. The second delay section may have a fixed delay. The oscillator circuit may include a circuit output for an output signal having a frequency that is a function of the delay due to the first delay section and the second delay section. The circuit output may comprise the output end of the second delay section.

In some embodiments, each of the variable capacitors in the first and second RC networks in the first delay section may comprise a plurality of switched capacitors, wherein the control signal provided to the programmable delay stage selectively sets each of the plurality of switched capacitors to an ON state or an OFF state. In some embodiments, when a switched capacitor is in the ON state, a node of the switched capacitor is electrically connected to a DC voltage. In other embodiments, when a switched capacitor is in the ON state, a node of the switched capacitor is electrically connected to ground potential.

In some embodiments, the control signal may be provided to the variable capacitor in the first RC network. The oscillator circuit may further include an additional control signal provided to the variable capacitor in the second RC network.

In some embodiments, the first delay section may further comprise at least a third RC network connected in series with the second RC network and comprising a resistor and a variable capacitor.

In some embodiments, the second delay section may comprise an RC network comprising a fixed value resistive component and a fixed value capacitive component. At least one node of the capacitive component may swings above supply voltage of the oscillator circuit. The at least one node of the capacitive component may further swing below ground potential.

In accordance with aspects of the present disclosure, an oscillator circuit may comprise a first inverter stage and a second inverter stage having an input electrically connected to an output of the first inverter stage. The second inverter stage may have an output for an output signal of the oscillator circuit. The oscillator circuit may comprise an RC circuit comprising a resistor element connected to a capacitive element. The RC circuit may be electrically connected between the input and output of the second inverter stage. The oscillator circuit may comprise at least one variable delay stage having a delay that is set by a control signal provided to the at least one variable delay stage. The at least one variable delay stage may be electrically connected between a node in the RC circuit that connects the resistor element and the capacitor element and an input of the first inverter stage. A frequency of the output signal may be dependent on a delay of the at least one variable delay stage.

In some embodiments, the oscillator circuit may further comprise at least one additional variable delay stage connected in series with the at least one variable delay stage, and having a delay that is dependent on a control signal provided to the at least one additional variable delay stage.

In some embodiments, a voltage level at the node that connects the resistor element and the capacitor element may swings above and below a supply voltage of the oscillator circuit and above and below a ground potential during operation of the oscillator circuit.

In some embodiments, the at least one variable delay stage may comprise a resistor and a variable capacitor, wherein the control signal provided to the at least one variable delay stage sets a capacitance of the variable capacitor. The delay of the at least one variable delay stage may be dependent on the capacitance of the variable capacitor.

In some embodiments, the at least one variable delay stage may comprise a plurality of switched capacitors, wherein the control signal sets each of the plurality of switched capacitors to an ON state or an OFF state. In some embodiments, when a switched capacitor is in the ON state, a node of the switched capacitor is electrically connected to a DC voltage or to ground potential.

In some embodiments, at least one node of the capacitive element of the RC circuit swings above supply voltage of the oscillator circuit and below ground potential.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1A:
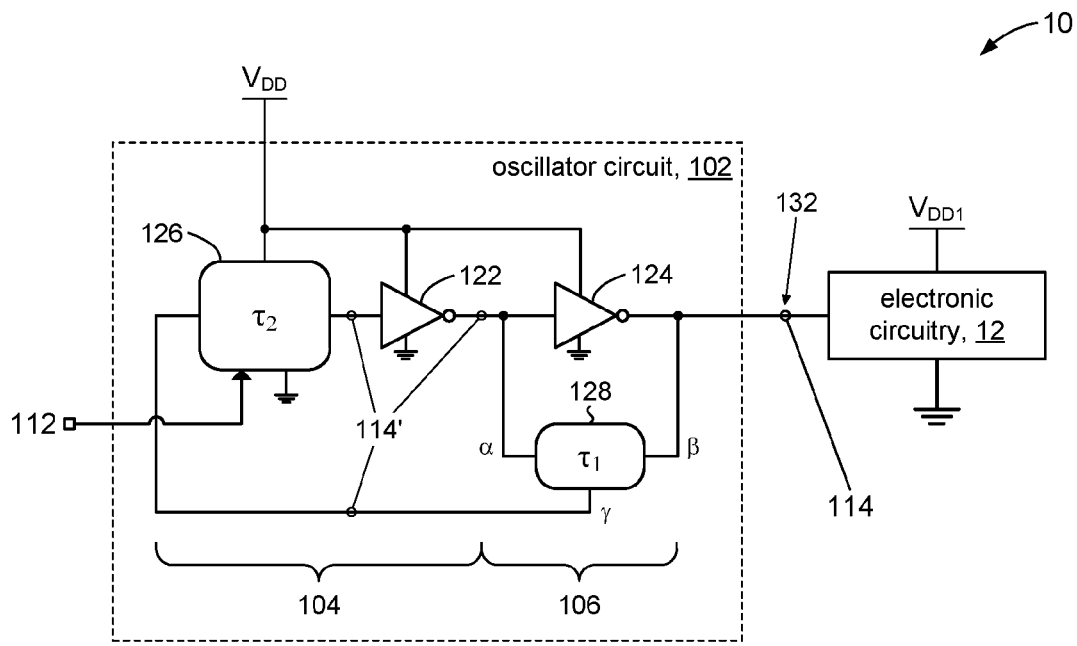
FIGS. 1A and 1B show oscillator circuits in accordance with the present disclosure.

FIG. 1A shows an electronic circuit 10 in accordance with an embodiment of the present disclosure. The electronic circuit 10 may include an oscillator circuit 102 and electronic circuitry 12. The oscillator circuit 102 may have an output 114 for an output signal (e.g., a clock signal 132), which for example, may be used by the electronic circuitry 12. The electronic circuit 10 may be a component in an electronic device (not shown). The oscillator circuit 102 may be powered by a source $V_{DD}$ and the electronic circuitry 12 may be powered by a source $V_{DD1}$. In some embodiments, $V_{DD}$ may be the same as $V_{DD1}$, and in other embodiments $V_{DD}$ may be different from $V_{DD1}$.

The oscillator 102 may comprise a first delay section 104 and a second delay section 106 electrically connected in series with the first delay section 104. In accordance with the present disclosure, the first delay section 104 may be characterized by a negative gain between the input end of the first delay section 104 and the output end of the first delay section 104. With reference to FIG. 1A, for example, in some embodiments the first delay section 104 may include a delay stage 126 connected in series with an inversion stage 122. As discussed in more detail below, the first delay section 104 may be further characterized by having a variable delay. Further, by negative gain, we mean that a given positive change (say of the voltage) at the input end produces a negative change (of the voltage) at the output end.

The input end of the first delay section 104 may be defined by the input side of delay stage 126. The output end of the first delay section 104 may be defined by the output of the inversion stage 122. It will be clear from the discussion below that the gain of delay stage 126 is positive. The inversion stage 122 has a negative gain, and so the first delay section 104 has a negative gain. In some embodiments, the inversion stage 122 may comprise a single inverter as shown in FIG. 1A. In other embodiments, the inversion stage 122 may comprise any odd number of inverters, and in general any suitable circuitry that can provide a negative gain.

The second delay section 106 may likewise be characterized by a negative gain between its input end and its output end. In some embodiments, the second delay section 106 may include an inversion stage 124 connected across (in parallel with) a delay stage 128; for example, at terminals α and β of delay stage 128. The input and output ends of the second delay section 106 may be the input and output, respectively, of the inversion stage 124. The inversion stage 124 has a negative gain, and so the second delay section 106 has a negative gain. In some embodiments, the inversion stage 124 may comprise a single inverter as shown in FIG. 1A. In other embodiments, the inversion stage 124 may comprise any odd number of inverters, and in general any suitable circuitry that can provide a negative gain.

The first delay section 104 may be connected to the output 114 via the second delay section 106 to define a feedback loop around which oscillations can propagate to produce the clock signal 132. The frequency $f_{CLOCK}$ of the clock signal 132 is generally a function of the delay $\tau_1$ of the delay stage 128 and the delay $\tau_2$ of the delay stage 126. The clock signal 132 may be tapped out or otherwise produced at the output of the second inversion stage 124, as depicted in FIG. 1A. However, it is understood that the clock signal 132 may be obtained at other points 114' within the loop.

Figure 1B:
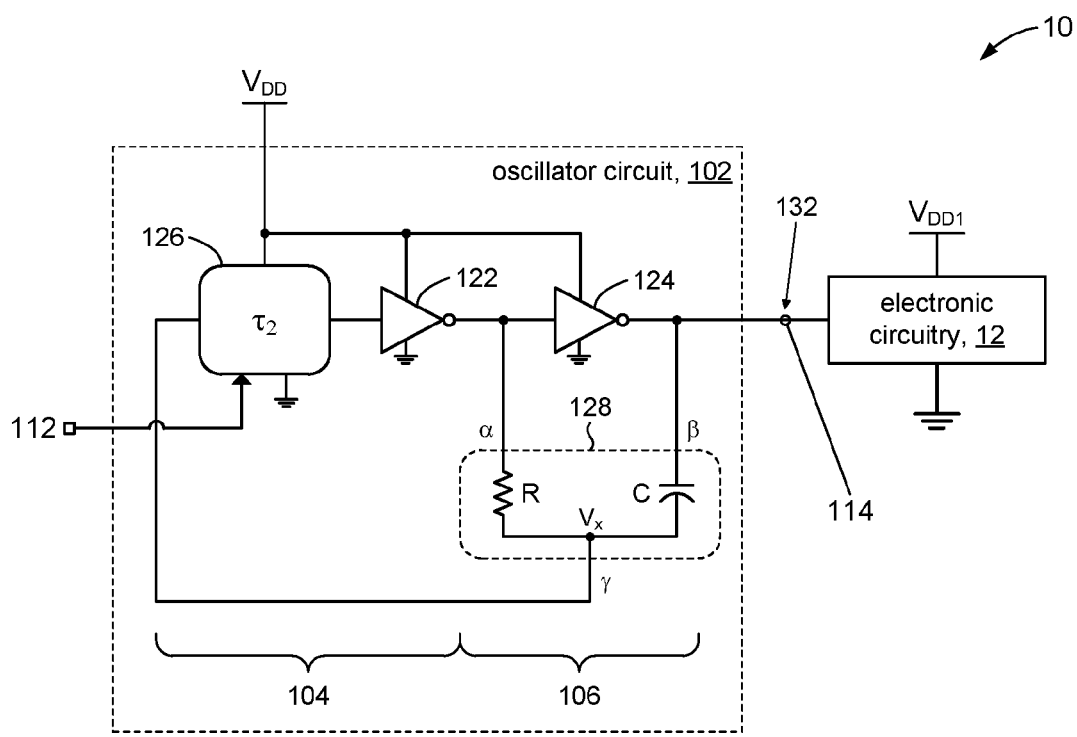

Referring to FIG. 1B, in some embodiments the delay stage 128 may comprise an RC network comprising a resistor R and a capacitor C. Terminal α of the delay stage 128 may be connected to the resistor R and capacitor C may be connected to terminal β. Terminal γ of the delay stage 128 may be connected to a node $V_X$ to which resistor R and capacitor C are connected. The delay $\tau_1$ of the RC network is generally a function of a time constant (sometimes referred to as the RC time constant) defined as R×C, which represent respective element values of resistor R and capacitor C. In some embodiments, resistor R and capacitor C may be fixed-value elements. Accordingly, the delay stage 128 may provide a fixed delay.

It is noted that node $V_X$ is not connected to ground potential, as compared to other elements in the oscillator circuit 102 (e.g., inversion stages 122, 124, delay stage 126). Rather, node $V_X$ is a "floating" node, which means that the potential at node $V_X$ may vary as the voltage across capacitor C varies during operation of the oscillator circuit 102. For example, during operation the voltage at node $V_X$ may swing above and below the supply voltage in one half of a cycle of the clock signal 132 at the output 114, and may swing above and below ground potential in the other half of the cycle. This aspect of the present disclosure is discussed below.

Returning to FIG. 1A, in accordance with some embodiments, the delay stage 126 may have a variable (tunable, programmable) delay. The delay stage 126 may receive a selector input signal 112 to select or otherwise set the delay $\tau_2$ of the delay stage 126. In some embodiments, the selector input 112 may be a digital code. In accordance with the present disclosure, the selector input 112 may change in order to select a different delay $\tau_2$ for the delay stage 126 during operation of the electronic circuit 10. For example, the selector input 112 may provide different digital codes to the delay stage 126, thus allowing for on-the-fly selection of a delay $\tau_2$.

The frequency of oscillation in oscillator circuit 102 may be controlled according to the delays $\tau_1$ and $\tau_2$. The delay $\tau_1$ may be determined, for example, during the design phase by selecting appropriate element values for resistor R and capacitor C in the delay stage 128. The delay of $\tau_1$ may be set by providing a suitable selector input 112 to the delay stage 126. Since the delay $\tau_2$ of the delay stage 126 may be set on-the-fly, the frequency of clock signal 132 produced by oscillator circuit 102 may likewise be set on-the-fly, namely by providing a suitable selector input 112 to the delay stage 126.

Figure 2:
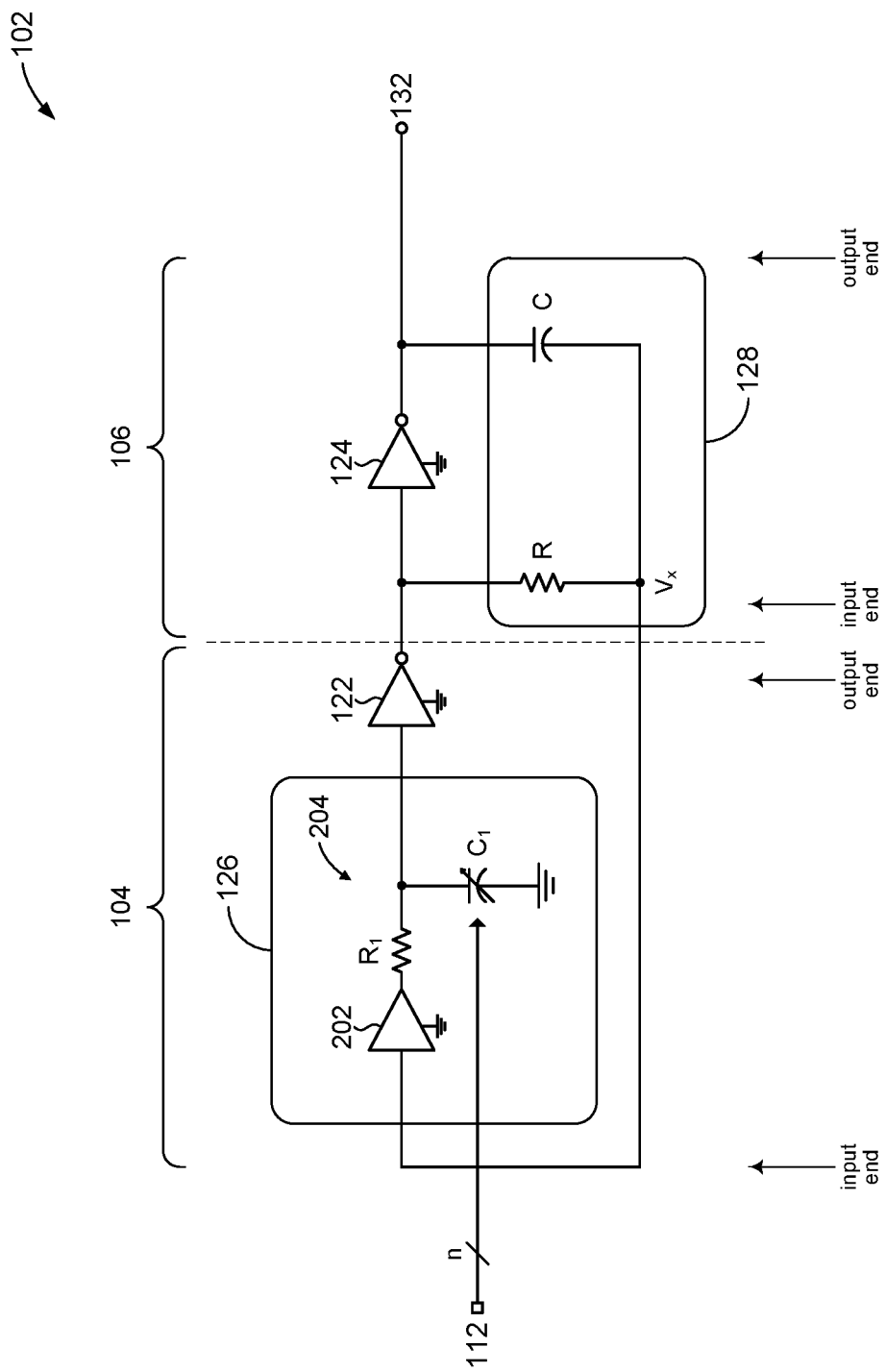
FIG. 2 shows an oscillator circuit in accordance with the present disclosure.

FIG. 2 shows additional details for delay stage 126 of the first delay section 104 in accordance with some embodiments of the present disclosure. In some embodiments, for example, the delay stage 126 may comprise a high input impedance non-inverting input buffer 202 and a variable RC network 204. The supply (not shown) for input buffer 202 may be the $V_{DD}$ supply provided to the delay stage 126, as illustrated in FIG. 1A for example.

The variable RC network 204 may comprise a resistor $R_1$ and a variable capacitor $C_1$. The selector input 112 may be an n-bit signal bus that can be provided to the variable capacitor $C_1$ to select or otherwise set a capacitance for the variable capacitor $C_1$. The delay $\tau_2$ of delay stage 126 may be determined based on a time constant defined as R×C, which are respective values of resistor $R_1$ and variable capacitor $C_1$. The delay $\tau_2$ may therefore be set depending on the capacitance setting of variable capacitor $C_1$.

One of ordinary skill will appreciate that any suitable delay circuitry may be used for the delay stage 126. Merely to illustrate the point, in other embodiments for example, the delay stage 126 may employ a tunable current source to charge a fixed capacitor. The delay stage 126 may use a current starved inverter with a tunable current source and/or a tunable capacitor, and so on.

Figure 2A:
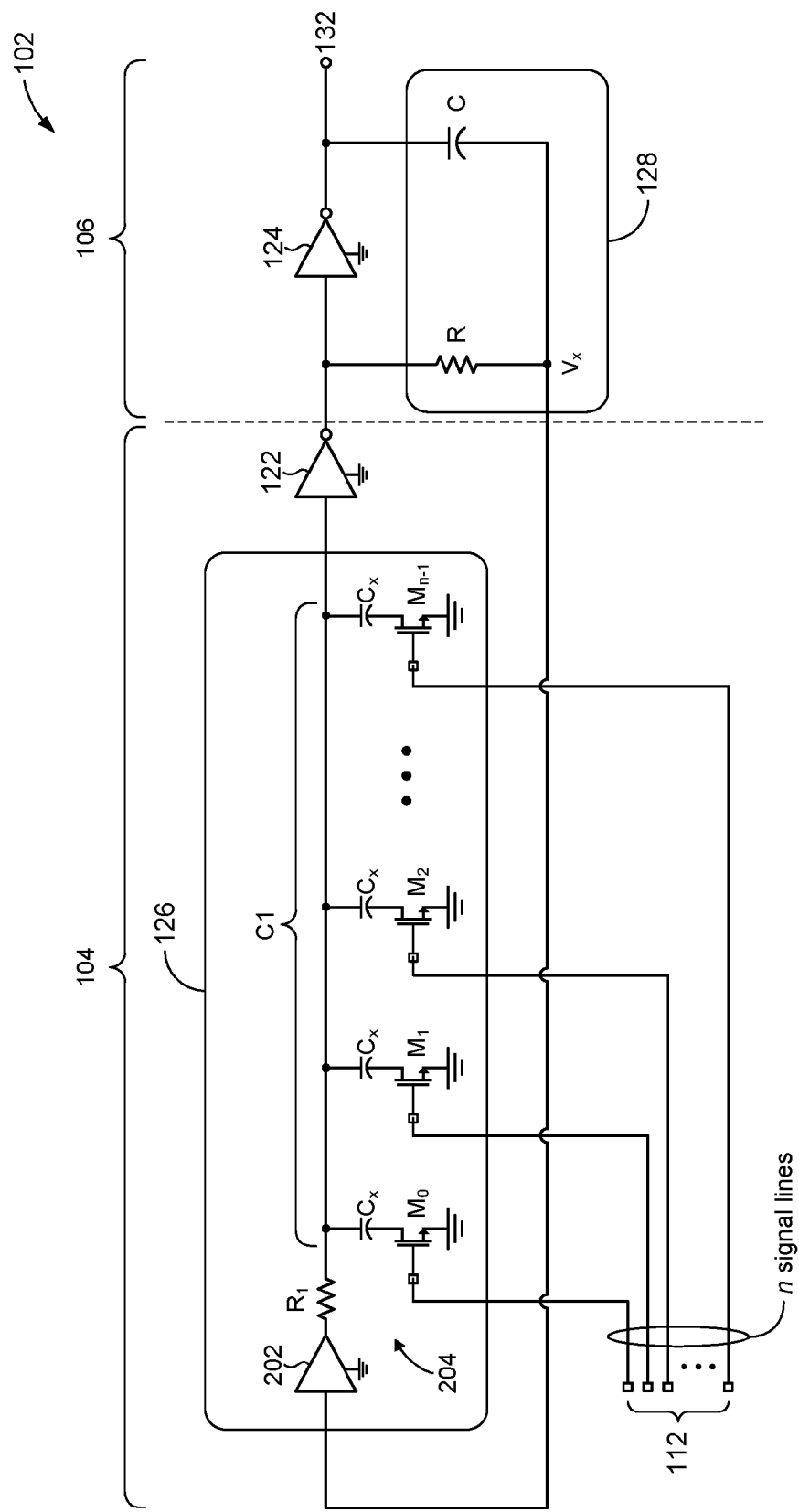
FIG. 2A shows details of a variable capacitor in accordance with the present disclosure.

FIG. 2A shows additional details of the variable capacitor $C_1$. In accordance with some embodiments, the variable capacitor $C_1$ may include a set of n fixed value switched capacitive elements C. The capacitive elements $C_X$ may be connected in parallel with each other. For example, each capacitive element $C_X$ may have a connection between resistor $R_1$ and a ground potential connection via a corresponding switch $M_0$-$M_{n-1}$. It will be appreciated that in other embodiments, the capacitive elements $C_X$ may be arranged in connection topologies other than in parallel.

The capacitive elements $C_X$ may be realized using any semiconductor technology suitable for a given application of the oscillator circuit 102. Merely to illustrate this point, in various embodiments, capacitive elements $C_X$ may be PN junction capacitors, MOSFET gate capacitors, metal-insulator-metal (MIM) capacitors, metal-oxide-metal (MOM) capacitors, and so on. The capacitive elements $C_X$ may be based on the same semiconductor technology, or they may be based on different technologies. In some embodiments, each of the capacitive elements $C_X$ may have the same capacitance. In other embodiments, the capacitive elements $C_X$ may have different capacitances.

The capacitive elements $C_X$ may be selectively switched to ground potential via a set of corresponding switches $M_0$-$M_{n-1}$. The switches $M_0$-$M_{n-1}$ may be any suitable switching device. In some embodiments, for example, the switches $M_0$-$M_{n-1}$ may be semiconductor switches such as NMOS transistors shown in FIG. 2A, for instance; although in other embodiments other transistor technologies or designs may be used, such as NFETs for example. In some embodiments, all the switches $M_0$-$M_{n-1}$ may be based on the same technology, or they may be based on several different technologies. Each of the n signal lines that comprise the selector input 112 may be connected to a respective one of the switches $M_0$-$M_{n-1}$. For example, in FIG. 2A, each signal line of the selector input 112 is connected to a respective gate terminal of the switches $M_0$-$M_{n-1}$. The input to selector input 112 may be generated by digital logic or other suitable circuitry associated with the oscillator circuit 102 or with electronic circuit 10 (FIG. 1A).

In accordance with the present disclosure, the nodes of capacitive elements $C_X$ in FIG. 2A are not floating nodes as explained above in connection with node $V_X$. Rather, in some embodiments, the nodes of capacitive elements $C_X$ may be electrically connected to or otherwise referenced to ground potential. In other embodiments, the capacitive elements $C_X$ may be electrically connected to or otherwise referenced to a DC voltage; e.g., a supply voltage such as $V_{DD}$. More generally, one of skill in the art will appreciate that the capacitive elements $C_X$ may be electrically connected to any suitable low impedance node.

In operation, any one or more of the n signal lines in the selector input 112 may be asserted to turn ON their corresponding switches $M_0$-$M_{n-1}$, and hence the corresponding capacitive element $C_X$. A switch (e.g., $M_0$) that is in the ON state connects its corresponding capacitive element $C_X$ to the RC network 204 (switched on), and conversely a switch that is in the OFF state disconnects its corresponding capacitive element $C_X$ from the RC network 204 (switched off). If the capacitive elements $C_X$ are connected in parallel, as shown in FIG. 2A for example, the capacitance of variable capacitor $C_1$ may be computed as the sum of the switched-on capacitive elements. Thus, the delay $\tau_2$ of the delay stage 126 may be set depending on which capacitive elements are switched on or switched off in the RC network 204.

In some embodiments, resistor $R_1$ may be a fixed value element such as shown in FIG. 2A. In other embodiments (not shown), resistor $R_1$ may be a variable resistor and capacitor $C_1$ may be a fixed value element. In still other embodiments, resistor $R_1$ may be a variable resistor and capacitor $C_1$ may be a variable capacitor.

Figure 3:
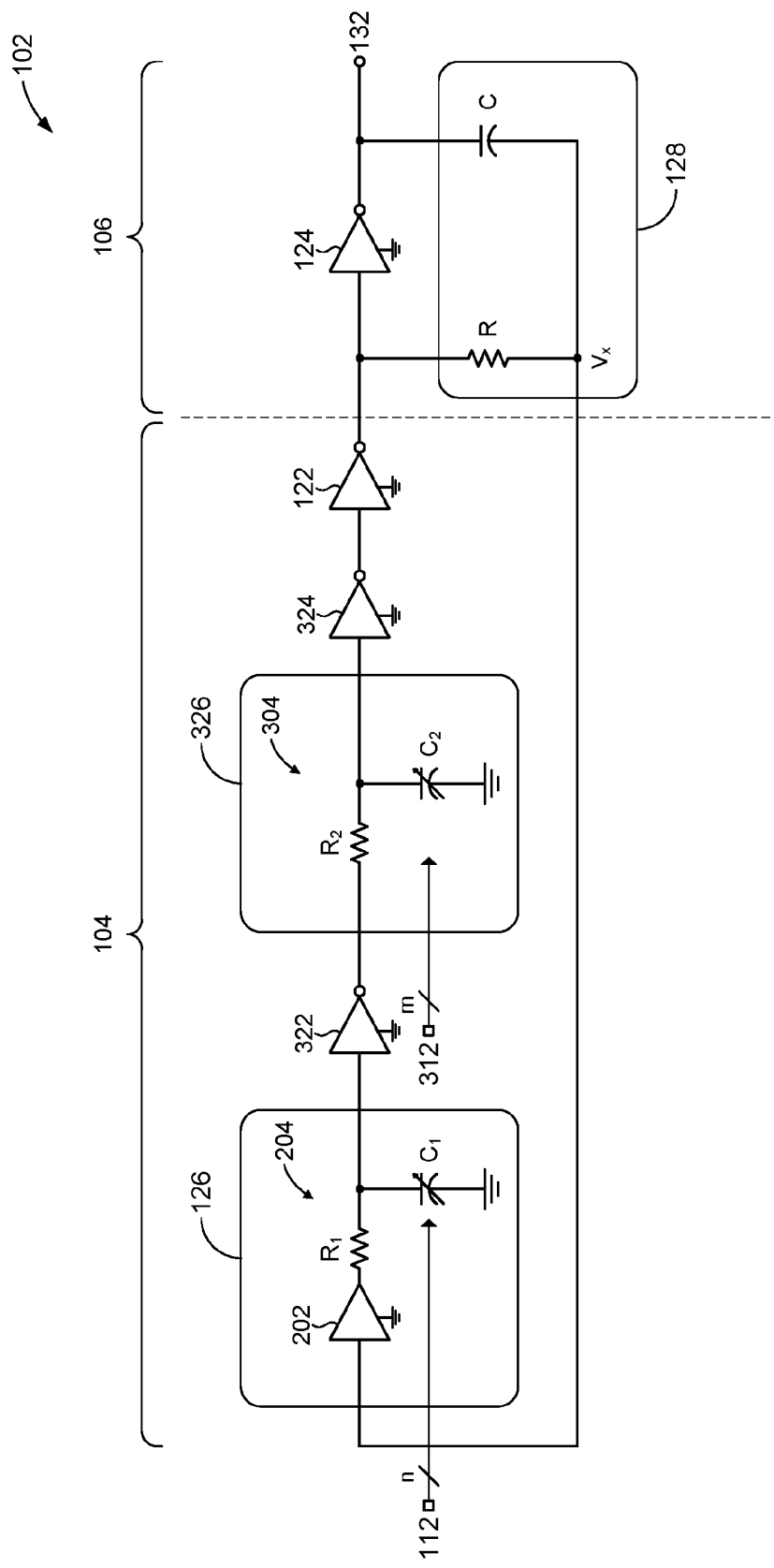
FIG. 3 shows an oscillator circuit in accordance with the present disclosure.

Referring to FIG. 3, in some embodiments in accordance with the present disclosure the first delay section 104 may comprise an additional delay stage 326 connected in series with the delay stage 126. An input inverter 322 may be provided to couple the oscillations produced at the output of delay stage 126 to the input of the additional delay stage 326; in other words, the inverter 322 keeps the oscillations going. An output inverter 324 may be provided to maintain a net negative gain between the input end and the output end of the first delay section 104. The supply (not shown) for input inverter 322 and output inverter 324 may be the same $V_{DD}$ supply provided to the delay stage 126, as illustrated in FIG. 1A for example. In some embodiments, the additional delay stage 326 can improve the noise performance of oscillator circuit 102.

The additional delay stage 326 may include a variable RC network 304 comprising a resistor $R_2$ and a variable capacitor $C_2$. A selector input 312 may comprise an m-bit signal bus that can be provided to the variable capacitor $C_2$ to select or otherwise set a capacitance for the variable capacitor $C_2$. The additional delay stage 326 may provide a delay $\tau_3$ that may be determined based on a time constant defined as R×C, which are respective values of resistor $R_2$ and variable capacitor $C_2$. The delay $\tau_3$ provided by additional delay stage 326 may therefore be set depending on the capacitance setting of variable capacitor $C_2$.

Figure 3A:
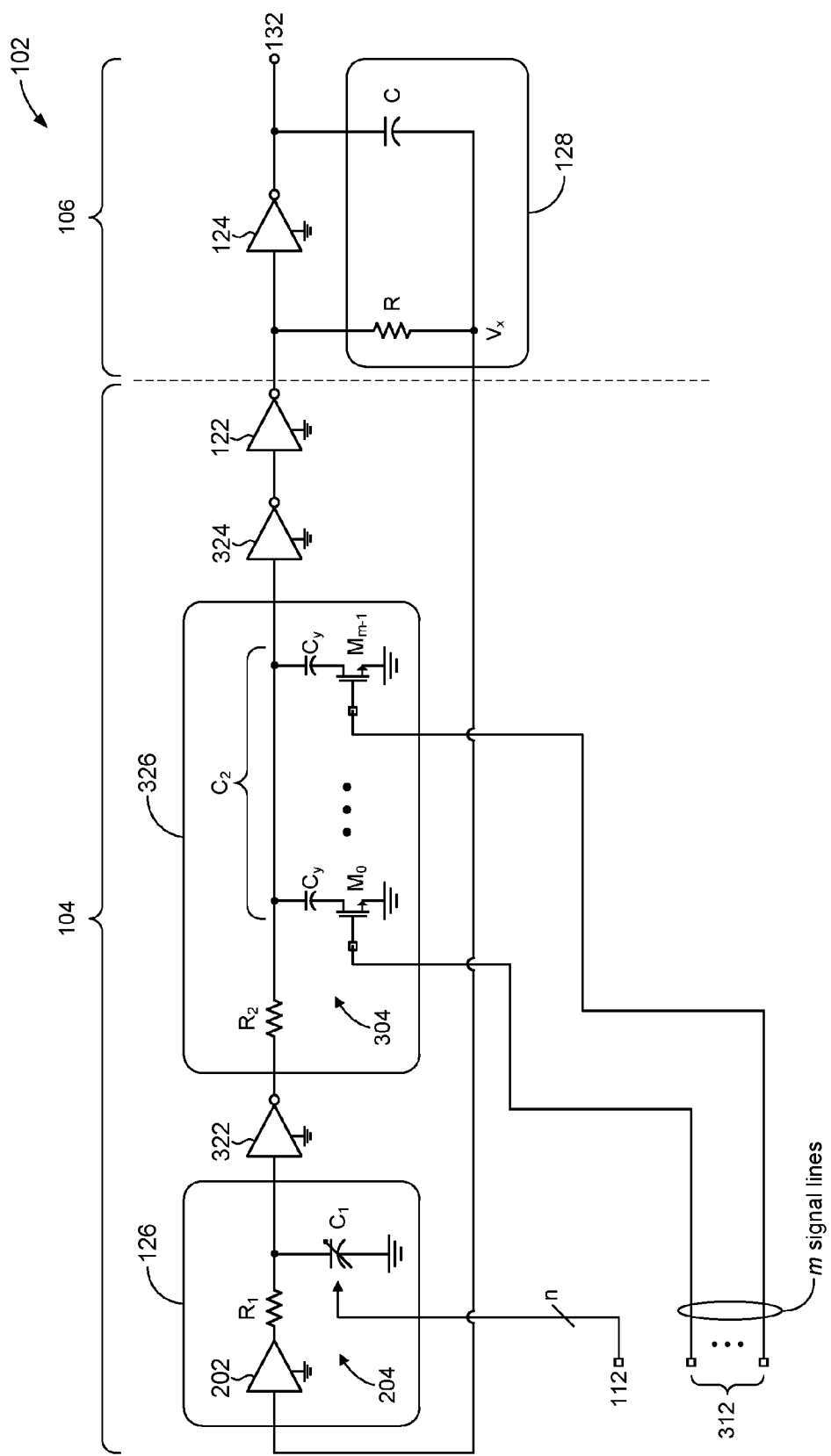
FIG. 3A shows details of a variable capacitor in accordance with the present disclosure.

FIG. 3A shows additional details of the variable capacitor $C_2$. In accordance with some embodiments, variable capacitor $C_2$ may comprise a set of m fixed value switched capacitive elements $C_y$. The capacitive elements $C_y$ may be connected in parallel with each other. In other words, each capacitive element $C_y$ may have a connection between resistor $R_2$ and a ground potential connection via a corresponding switch $M_0$-$M_{m-1}$. It will be appreciated that in other embodiments, the capacitive elements $C_y$ may be connected in connection topologies other than in parallel.

The capacitive elements $C_y$ may be realized using any semiconductor technology suitable for a given application of the oscillator circuit 102. Merely to illustrate this point, in various embodiments, capacitive elements $C_y$ may be PN junction capacitors, MOSFET gate capacitors, metal-insulator-metal (MIM) capacitors, metal-oxide-metal (MOM) capacitors, and so on. The capacitive elements $C_y$ may be based on the same semiconductor technology, or they may be based on different technologies. In some embodiments, each of the capacitive elements $C_y$ may have the same capacitance. In other embodiments, the capacitive elements $C_y$ may different capacitances.

The capacitive elements $C_y$ may be selectively switched to ground potential via a set of corresponding switches $M_0$-$M_{m-1}$. The switches $M_0$-$M_{m-1}$ may be any suitable switching device. In some embodiments, for example, the switches $M_0$-$M_{m-1}$ may be semiconductor switches such as PNP transistors shown in FIG. 3A, for example. In some embodiments, all the switches $M_0$-$M_{m-1}$ may be based on the same technology, or may they may be based on different technologies. Each of the m signal lines that comprise the selector input 312 may be connected to a respective one of the switches $M_0$-$M_{m-1}$. The input to selector input 312 may be generated by digital logic or other suitable circuitry associated with the oscillator circuit 102 or with electronic circuit 10 (FIG. 1A).

In accordance with the present disclosure, the nodes of capacitive elements $C_y$ in FIG. 3A are not floating. Rather, the nodes of capacitive elements $C_y$ may be electrically connected to ground potential. One of skill in the art will appreciate that in other embodiments, the capacitive elements $C_y$ may be electrically connected to a DC voltage; (e.g., supply $V_{DD}$). More generally, the capacitive elements $C_y$ may be electrically connected to any suitable low impedance node.

In operation, any one or more of the m signal lines in the selector input 312 may be asserted to turn ON their corresponding switches $M_0$-$M_{m-1}$. A switch (e.g., $M_0$) that is in the ON state connects its corresponding capacitive element (switched on) to the RC network 304, and conversely a switch that is in the OFF state disconnects its corresponding capacitive element (switched off) from the RC network 304. If the capacitive elements $C_y$ are connected in parallel, as shown in FIG. 3A for example, the capacitance of variable capacitor $C_2$ may be computed as the sum of the switched-on capacitive elements. Thus, the delay $\tau_3$ of the additional delay stage 326 may be set depending on which capacitive elements $C_y$ are switched on or switched off in the RC network 304.

In some embodiments, resistor $R_2$ may be a fixed value element such as shown in FIG. 3A. In other embodiments (not shown), resistor $R_2$ may be a variable resistor and capacitor $C_2$ may be a fixed value element. In still other embodiments (not shown), resistor $R_2$ may be a variable resistor and capacitor $C_2$ may be a variable capacitor.

In some embodiments, the selector inputs 112, 312 of respective delay stages 126, 326 may receive the same selection input; e.g., the same n-bit code may be provided to each selector input 112, 312. In other embodiments, each selector input 112, 312 may receive different selection inputs.

The frequency of oscillation in oscillator circuit 102 may be controlled according to the delays $\tau_1$, $\tau_2$, and $\tau_3$. As explained above, the delay $\tau_1$ in delay stage 128 may be fixed for resistor R and capacitor C. The delay $\tau_2$ of the delay stage 126 may be set by asserting appropriate bit lines that comprise selector input 112 for the delay stage 126. Likewise, the delay $\tau_3$ in delay stage 326 may be set by asserting appropriate bit lines that comprise selector signal 312.

Accordingly, the frequency of the clock signal 132 may be selected as a function of the variable delays $\tau_2$ and $\tau_3$.

Figure 4A:
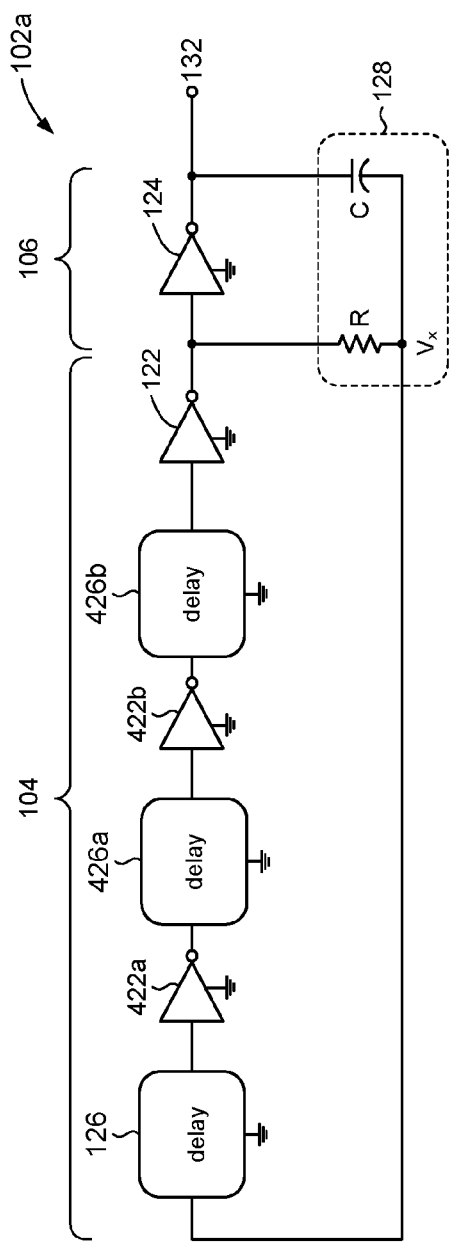
FIGS. 4A and 4B illustrate alternate embodiments in accordance with the present disclosure.

In some embodiments in accordance with the present disclosure, the first delay section 104 may comprise several additional delay stages connected in series. FIG. 4A, for example, is a schematic representation of an oscillator circuit 102a in accordance with some embodiments of the present disclosure. The first delay section 104 may comprise delay stage 126 and two additional delay stages 426a, 426b. Inverters 422a, 422b may be provided to couple the signal between delay stages. For example, inverter 422a may couple the signal between delay stage 126 and delay stage 422a, and likewise inverter 422b may couple the signal between delay stage 422a and delay stage 422b. Note that inverters 422a, 422b, 122 that comprise the first delay section 104 provide a net negative gain.

Figure 4B:
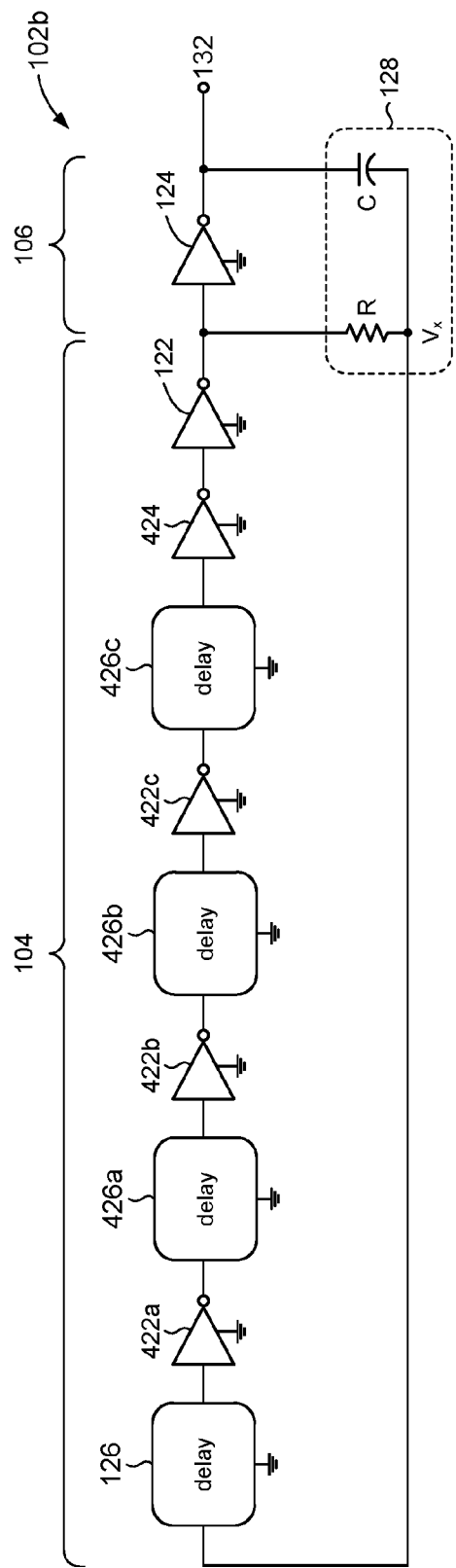

FIG. 4B is a schematic representation of an oscillator circuit 102b comprising a first delay section 102 that has three additional delay stages 426a, 426b, 426c and inverters 422a, 422b, 422c, 422d. The inverters 422a-422c couple the signal among delay stages 126 and 426-426c. It can be seen that the inverter 424 provides the first delay section 104 with a net negative gain.

TECHNICAL EFFECT AND ADVANTAGES

Figure 5:
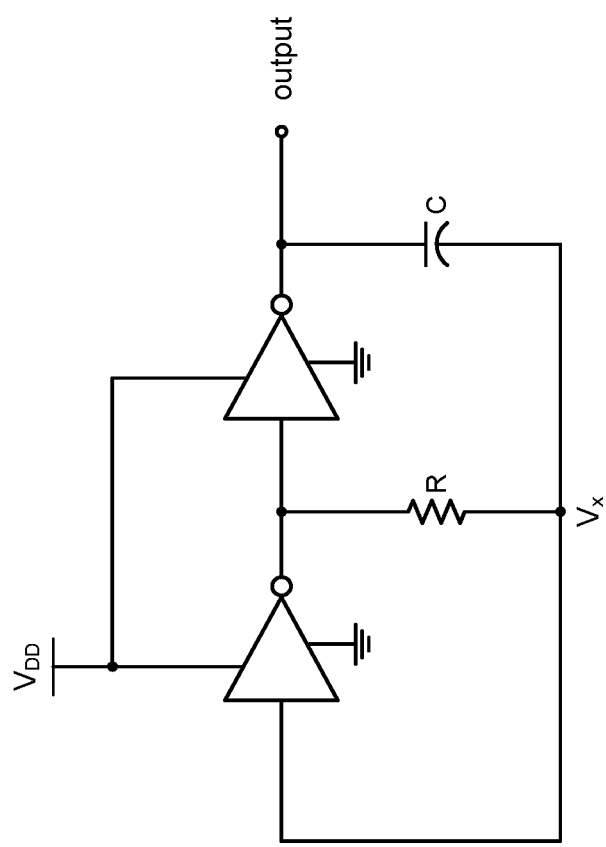
FIG. 5 shows an example of a conventional RC oscillator.

A conventional RC oscillator design, such as shown in FIG. 5, has many desirable properties. Such designs are generally insensitive to variations in supply voltage. The design is relatively simple, having few components. As a results these RC oscillators can achieve low noise performance. Some designs, for example, may achieve noise levels only 3 dB above the theoretical low limit. Because of their relatively simple designs, RC oscillators have smaller footprints on the IC chip.

The present disclosure provides an oscillator circuit having the capability of a programmable frequency to further improve the utility of RC oscillators. As shown in FIG. 5, for example, a basic RC oscillator design comprises two inverters (e.g., inversion stages 122, 124) and an RC network comprising a resistor R and a capacitor C. The RC network provides a delay that sets an operating frequency of the RC oscillator. Accordingly, varying the elements values of either R or C can serve to provide programmability in the operating frequency of the RC oscillator.

However, the method of making R or C may not be practical. Programmable resistors can be difficult to provide. High programmability requires the ability to modify the total R in small increments. This necessitates a large network of resistors and a large number of switches that have low ON resistance. Furthermore, the voltage across a switch can vary over the oscillation cycle thereby complicating the switch design. Using switched resistors to build a variable resistor may not practical.

Programmable capacitors can be difficult, since the capacitor C is a "floating" capacitor because of the behavior at node $V_X$. As explained above, the node $V_X$ is a floating node because the voltage at node $V_X$ may swing above and below the supply voltage in one half of a cycle of the output and above and below ground potential in the other half of the cycle. Programmable capacitors typically comprise a bank of switched capacitor elements. When the source (or drain) of a switch is connected at the node $V_X$, the state of the switch can become forward biased during portions of the cycle and conduct when it is supposed to be in an OFF (non-conducting) state. The presence of the floating node $V_X$ presents a challenge in using a variable capacitor at this location to provide a variable delay RC network and hence a variable frequency oscillator circuit. Thus, replacing C with a bank of switched capacitors to build a variable capacitor may not be easily accomplished.

Oscillator circuits in accordance with the present disclosure can overcome this challenge. As shown in FIG. 1B, a delay stage 126 can be provided separately from the RC network 128. The delay stage 126 may be grounded so that operation of the delay stage 126 is significantly less affected by voltage swings in the circuit.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An oscillator circuit having a programmable output frequency comprising:
   a first delay section having an input end and an output end, the first delay section having a negative gain between the input end and the output end, the first delay section having a variable delay that is set by a control signal provided to the first delay section;
   a second delay section electrically connected in series with the first delay section, the second delay section having an input end and an output end, the second delay section having a negative gain between the input end and the output end, the second delay section having a fixed delay, wherein the second delay section comprises a first RC network comprising a resistive component and a capacitive component, wherein at least one node of the capacitive component swings above supply voltage of the oscillator circuit and below ground potential; and
   a circuit output for an output signal having a frequency that is a function of the delay due to the first delay section and the second delay section, the circuit output comprising the output end of the second delay section.

2. The circuit of claim 1, wherein the first delay section comprises: a second RC network comprising a resistor and a variable capacitor; and a third RC network connected in series with the second RC network and comprising a resistor and a variable capacitor, a delay of the first delay section determined based on capacitances of the variable capacitors of the second and third RC networks.

3. The circuit of claim 2 wherein the control signal sets the capacitance of the variable capacitor of the second RC network, and an additional control signal sets the capacitance of the variable capacitor of the third RC network.

4. The circuit of claim 1, wherein the first delay section comprises a second RC network comprising a resistor and a variable capacitor, wherein the control signal provided to the first delay section sets a capacitance of the variable capacitor of the second RC network, a delay of the first delay section determined based on the capacitance of the variable capacitor.

5. The circuit of claim 1, wherein the first delay section comprises a plurality of switched capacitors, wherein the control signal selectively sets each of the plurality of switched capacitors to an ON state or an OFF state.

6. The circuit of claim 5, wherein when a switched capacitor is in the ON state, the switched capacitor has a node electrically connected to a DC voltage.

7. The circuit of claim 5, wherein when a switched capacitor is in the ON state, the switched capacitor has a node electrically connected to ground potential.

8. The circuit of claim 5, wherein the control signal is an n-bit word.

9. The circuit of claim 1, wherein the resistive component includes a fixed value resistive component and the capacitive component includes a fixed value capacitive component.

10. The circuit of claim 1, wherein the first delay section is electrically connected to the circuit output via the second delay section in a feedback loop.

11. An oscillator circuit comprising:
a first delay section having an input end and an output end, the first delay section having a negative gain between the input end and the output end, the first delay section comprising a first RC network comprising a resistor and a variable capacitor and a second RC network connected in series with the first RC network and comprising a resistor and a variable capacitor;
at least one control signal provided to at least the variable capacitor of the first RC network to set a delay of the first delay section;
a second delay section electrically connected in series with the first delay section, the second delay section having an input end and an output end, second delay section having a negative gain between the input end and the output end, the second delay section having a fixed delay, wherein the second delay section comprises a third RC network comprising a resistive component and a capacitive component, wherein at least one node of the capacitive component swings above supply voltage of the oscillator circuit and below ground potential; and
a circuit output for an output signal having a frequency that is a function of the delay due to the first delay section and the second delay section, the circuit output comprising the output end of the second delay section.

12. The circuit of claim 11, wherein each of the variable capacitors in the first and second RC networks in the first delay section comprises a plurality of switched capacitors, wherein the control signal provided to the programmable delay stage selectively sets each of the plurality of switched capacitors to an ON state or an OFF state.

13. The circuit of claim 12, wherein when a switched capacitor is in the ON state, a node of the switched capacitor is electrically connected to a DC voltage.

14. The circuit of claim 12, wherein when a switched capacitor is in the ON state, a node of the switched capacitor is electrically connected to ground potential.

15. The circuit of claim 11, wherein the control signal is provided to the variable capacitor in the first RC network, the circuit further comprising an additional control signal provided to the variable capacitor in the second RC network.

16. The circuit of claim 11, wherein the first delay section further comprises at least a fourth RC network connected in series with the second RC network and comprising a resistor and a variable capacitor.

17. The circuit of claim 11, wherein the resistive component includes a fixed value resistive component and the capacitive component includes a fixed value capacitive component.

18. An oscillator circuit comprising:
a first inverter stage;
a second inverter stage having an input electrically connected to an output of the first inverter stage, the second inverter stage having an output for an output signal of the oscillator circuit;
an RC circuit comprising a resistor element connected to a capacitive element, the RC circuit electrically connected between the input and output of the second inverter stage, wherein at least one node of the capacitive element of the RC circuit swings above supply voltage of the oscillator circuit and below ground potential; and
at least one variable delay stage having a delay that is set by a control signal provided to the at least one variable delay stage, the at least one variable delay stage electrically connected between a node in the RC circuit that connects the resistor element and the capacitive element and an input of the first inverter stage,
a frequency of the output signal being dependent on a delay of the at least one variable delay stage.

19. The circuit of claim 18, further comprising at least one additional variable delay stage connected in series with the at least one variable delay stage, and having a delay that is dependent on a control signal provided to the at least one additional variable delay stage.

20. The circuit of claim 18, wherein the at least one node of the capacitive element corresponds to a node that connects the resistor element and the capacitor element.

21. The circuit of claim 18, wherein the at least one variable delay stage comprises a resistor and a variable capacitor, wherein the control signal provided to the at least one variable delay stage sets a capacitance of the variable capacitor, wherein the delay of the at least one variable delay stage is dependent on the capacitance of the variable capacitor.

22. The circuit of claim 18, wherein the at least one variable delay stage comprises a plurality of switched capacitors, wherein the control signal sets each of the plurality of switched capacitors to an ON state or an OFF state.

23. The circuit of claim 22, wherein when a switched capacitor is in the ON state, a node of the switched capacitor is electrically connected to a DC voltage or to ground potential.

* * * * *